(12) United States Patent
Kim et al.

(10) Patent No.: US 7,151,045 B2
(45) Date of Patent: Dec. 19, 2006

(54) METHOD FOR SEPARATING SAPPHIRE WAFER INTO CHIPS USING DRY-ETCHING

(75) Inventors: Ju Hyun Kim, Kyungki-do (KR); Bang Won Oh, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 96 days.

(21) Appl. No.: 10/810,634

(22) Filed: Mar. 29, 2004

(65) Prior Publication Data
US 2005/0064615 A1    Mar. 24, 2005

(30) Foreign Application Priority Data
Sep. 23, 2003    (KR)    ............... 10-2003-0066080

(51) Int. Cl.
H01L 21/46    (2006.01)
H01L 21/78    (2006.01)
H01L 21/301    (2006.01)

(52) U.S. Cl. ............... 438/462; 438/110; 438/113; 438/114; 257/E21.599

(58) Field of Classification Search ............... 438/110, 438/113, 114, 462; 257/E21.599
See application file for complete search history.

(56) References Cited

U.S. PATENT DOCUMENTS 6,221,751 B1 *  4/2001  Chen et al. ............. 438/612
6,465,158 B1   10/2002  Sekiya
6,583,032 B1    6/2003  Ishikawa et al. ......... 438/462
6,593,170 B1    7/2003  Tateiwa et al.
6,916,725 B1 *  7/2005  Yamaguchi ............ 438/459

FOREIGN PATENT DOCUMENTS

KR    2001-81952 A    8/2001
KR    2002-33592 A    5/2002

OTHER PUBLICATIONS

Wolf and Tauber; "Silicon Processing for the VLSI Era vol. 1: Process Technology" p. 541; 1986; Lattice Press; Sunset Beach, CA.*

* cited by examiner

*Primary Examiner*—Fernando L. Toledo
(74) *Attorney, Agent, or Firm*—Lowe Hauptman & Berner, LLP.

(57) ABSTRACT

A method for singulating a sapphire wafer, provided with semiconductor elements formed thereon, into unit chips includes (a) grinding a rear surface of the sapphire wafer so that the sapphire wafer has a designated thickness; (b) lapping the rear surface of the ground sapphire wafer so that the sapphire wafer has a designated thickness; (c) dry-etching the rear surface of the lapped sapphire wafer so that the sapphire wafer has a uniform thickness; and (d) scribing the rear surface of the dry-etched sapphire wafer.

20 Claims, 9 Drawing Sheets

PRIOR ART

PRIOR ART

PRIOR ART

PRIOR ART

METHOD FOR SEPARATING SAPPHIRE WAFER INTO CHIPS USING DRY-ETCHING

BACKGROUND OF THE INVENTION

1. Field of the Invention

The present invention relates to a method for separating a sapphire wafer, adapted to manufacture a GaN semiconductor light emitting diode (LED), into chips, and more particularly to a method for separating a sapphire wafer into chips by scribing the sapphire wafer, after grinding and lapping a rear surface of the sapphire wafer and then dry-etching the sapphire wafer, thus allowing the sapphire wafer to be efficiently scribed.

2. Description of the Related Art

Recently, LED displays, serving as visual information transmission media, starting from providing alpha-numerical data have been developed to provide various moving pictures such as CF images, graphics, video images, etc. Further, the LED displays have been developed so that light emitted from the displays is changed from a solid color into colors in a limited range using red and yellowish green LEDs and then into total natural colors using the red and yellowish green LEDs and a newly proposed GaN high-brightness blue LED. However, the yellowish green LED emits a beam having a brightness lower than those of the red and blue LEDs and a wavelength of 565 nm, which is unnecessary for displaying the three primary colors of light. Accordingly, with the yellowish green LED, it is impossible to substantially display the total natural colors. Thereafter, in order to solve the above problems, there has been produced a GaN high-brightness pure green LED, which emits a beam having a wavelength of 525 nm suitable for displaying the total natural colors. The LED display represents a high-quality screen displaying total natural colors having long life span, high brightness and high visibility in accordance with the development of the GaN semiconductor LEDs. Thereby, a large-scale color outdoor LED visual display having a size of 100 inches or more has been proposed, and then developed as an advanced visual information transmission medium, which is connected to a computer to improve a level of outdoor commercial advertisement and displays various visual real-time information including news.

When a blue or green GaN semiconductor LED employed by a color LED display is manufactured, a GaN single crystal is grown on a heterogeneous substrate by a vapor growth method such as an MOCVD (Metal Organic Chemical Vapor Deposition) or HVPE (Hydride Vapor Phase Epitaxy) method, or an MBE (Molecular Beam Epitaxy) method. Here, a sapphire ($\alpha$-$Al_2O_3$) substrate or a SiC substrate is used as the heterogeneous substrate. Particularly, the sapphire substrate is made of a crystal having Hexa-Rhombo (R3c) type symmetry, and has a lattice constant in a direction of a C-axis of 13.001 Å and a lattice distance in a direction of an A-axis of 4.765 Å. Orientation planes of sapphire substrate include a C (0001) plane, an A (1120) plane, an R (1102) plane, etc. Since the C plane of the sapphire substrate has a GaN thin film easily grown thereon, and is low-priced and stable at a low temperature, compared to the SiC substrate, the sapphire substrate is mainly used for the blue or green LED.

Generally, a GaN semiconductor LED comprises a sapphire substrate, a first conductive clad layer, an active layer and a second conductive clad layer. The first conductive clad layer, the active layer and the second conductive clad layer are sequentially formed on the sapphire substrate. The first conductive clad layer includes an n-type GaN layer and an n-type AlGaN layer, and the active layer includes an undoped InGaN layer having a multi-quantum well structure. The second conductive clad layer includes a p-type GaN layer and a p-type AlGaN layer. In order to improve lattice matching between the n-type GaN layer and the sapphire substrate, a buffer layer such as an AlN/GaN layer is formed on the sapphire substrate prior to the growth of the n-type GaN layer on the sapphire substrate. In order to form two electrodes on an upper surface of the sapphire substrate, which is an electrical insulator, the second conductive clad layer and the active layer are etched at a designated area so that an upper surface of the first conductive clad layer is selectively exposed to the outside, and a first electrode is formed on the exposed upper surface of the first conductive clad layer. Since the second conductive clad layer has a comparatively high resistance, an Ohmic contact layer is additionally formed on the upper surface of the second conductive clad layer and a second electrode is formed on an upper surface of the Ohmic contact layer. In an actual manufacturing process, a sapphire wafer is used as the sapphire substrate.

After the first conductive clad layer, the active layer, the second conductive clad later and the electrodes are formed on the sapphire wafer as described above, the sapphire wafer is separated into individual semiconductor chips. Here, since sapphire is a very solid material (having mohs hardness of 9) in physiochemical properties, the rear surface of the sapphire wafer is ground, lapped and polished so that the thickness of the sapphire wafer is reduced, and is then scribed into individual chips using a diamond tip. Thereby, the sapphire wafer is separated into the chips.

Figure 1:
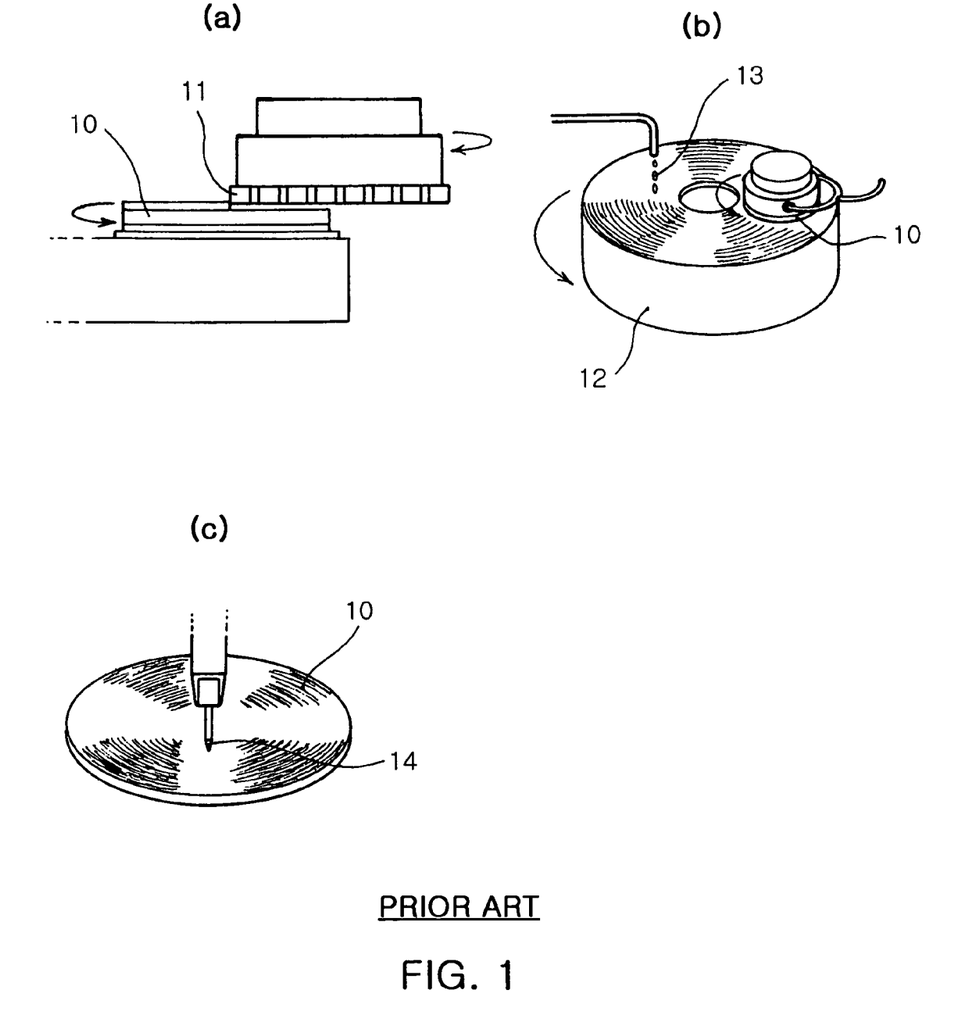
FIGS. 1a to 1c are schematic views illustrating a conventional process for separating a sapphire wafer into chips.

FIGS. 1a to 1c are schematic views illustrating a conventional process for separating a sapphire wafer into chips. FIG. 1a shows a grinding step. As shown in FIG. 1a, a rear surface of a sapphire wafer 10 is ground so as to have a designated thickness (for example, 115 μm) using a rotating diamond wheel 11. Then, as shown in FIG. 1b, the ground sapphire wafer 10 is lapped and polished. In a lapping step, the sapphire wafer 10 is mounted on a lapping plate 12 and then ground so as to have a designated thickness (for example, 81 μm) using a diamond slurry 13 having a particle size of 6 μm. After the lapping of the sapphire wafer 10, as shown in FIG. 1b, the sapphire wafer 10 is polished so as to have a designated thickness (for example, 80 μm) using a diamond slurry 13 having a particle size of 3 μm. Then, as shown in FIG. 1c, the polished sapphire wafer 10 is scribed and separated into a plurality of chips using a diamond tip 14.

Figure 2:
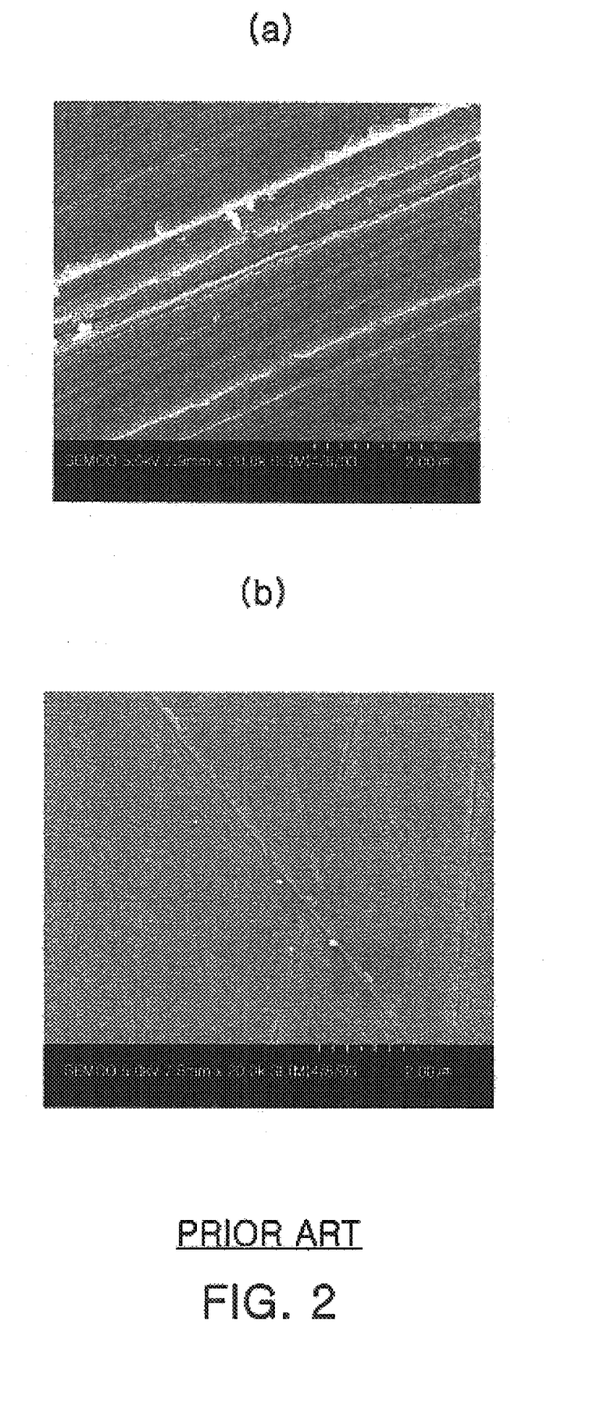
FIG. 2a is a scanning electron microscopic photograph of a surface of the sapphire wafer after a lapping step.
FIG. 2b is a scanning electron microscopic photograph of the surface of the sapphire wafer after a polishing step.
Figure 3:
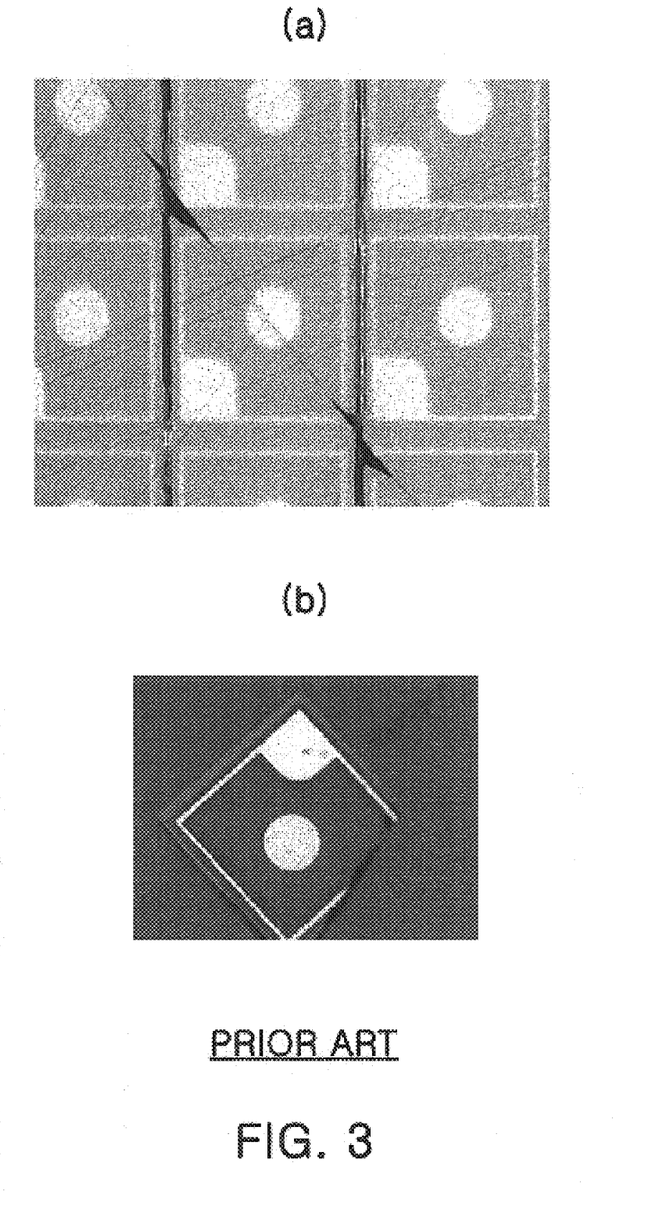
FIG. 3a is a photograph of a sapphire wafer scribed into chips after the lapping step.
FIG. 3b is a photograph of a resulting chip separated from the sapphire wafer after the lapping step.

FIG. 2a is a scanning electron microscopic photograph of the rear surface of the sapphire wafer 10 after the above lapping step, in which considerably deep scratches are formed. Such a rear surface of the sapphire wafer 10 is rough, thus having a reduced degree of clearness. When the above rear surface of the lapped sapphire wafer 10 is scribed, the rear surface of the lapped sapphire wafer 10 has a high processing stress and is easily cut with the diamond tip 14. However, as shown in FIG. 3a, serious cracks are generated on the rear surface of the lapped sapphire wafer 10 due to the deep scratches formed therein, and as shown in FIG. 3b, chips separated from the lapped sapphire wafer 10 are partially broken. Thus, after the lapping step, the rear surface of the sapphire wafer 10 is polished using a diamond slurry having a smaller particle size than that of the diamond slurry used in the lapping step.

Figure 4:
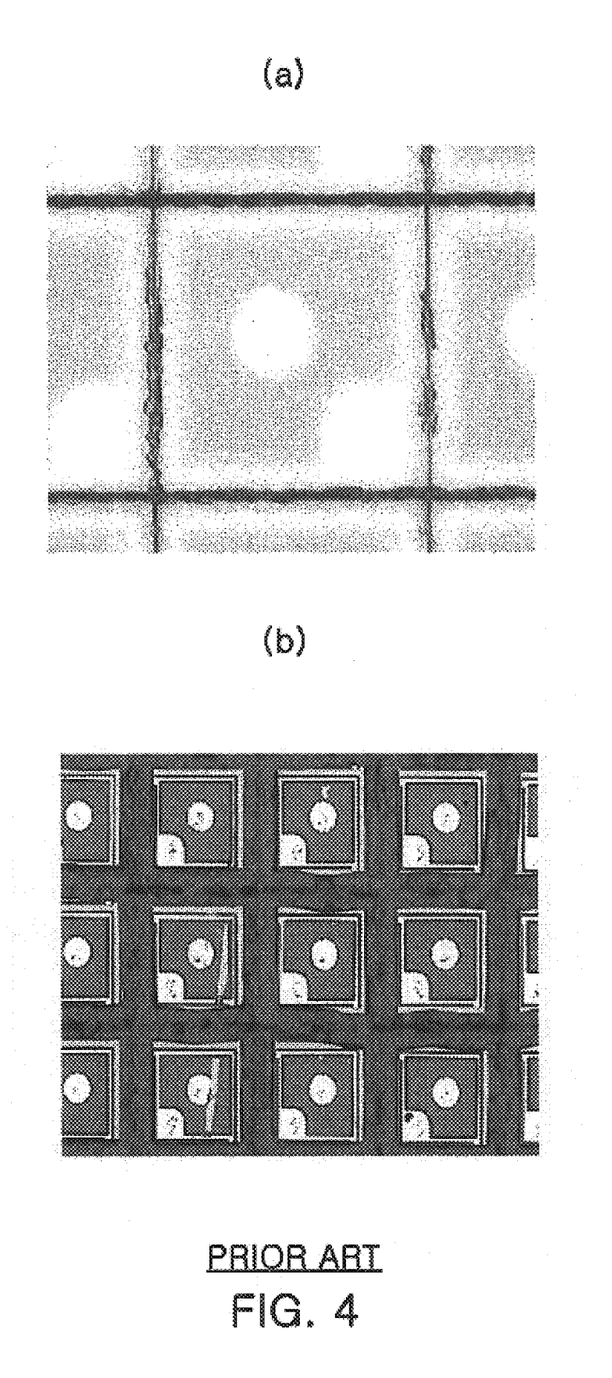
FIG. 4a is a photograph of a sapphire wafer scribed into chips after the polishing step.
FIG. 4b is a photograph of a resulting chip separated from the sapphire wafer after the polishing step.

FIG. 2b is a scanning electron microscopic photograph of the surface of the sapphire wafer after the above polishing step, in which the scratches shown in FIG. 2a are almost all removed. The scratches formed in the rear surface of the sapphire wafer are almost all removed by the polishing step. Thereby, the sapphire wafer has a high degree of clearness, and a semiconductor light emitting diode made of the sapphire wafer has an improved quality. However, the above rear surface of the polished sapphire wafer is smooth and has a low processing stress. That is, when the above rear surface of the polished sapphire wafer is scribed, the rear surface of the polished sapphire wafer has a low surface resistance and is not easily cut with the diamond tip. FIG. 4a is a photograph of the sapphire wafer scribed into chips with the diamond tip after the polishing step. As shown in FIG. 4a, boundaries of the scribed chips are not clean. When the sapphire wafer is separated into individual chips under this condition, there are generated defects in the shape of the obtained chips as shown in FIG. 4b, thus decreasing yield of the chips. The above-described conventional method increases the quantity of abrasion of the diamond tip, which is an expensive piece of equipment, thus increasing unit cost of chip products.

Accordingly, there is required a method for separating a sapphire wafer into chips, which prevents defects in the shape of the obtained chips and reduces the quantity of abrasion of the expansive diamond tip.

SUMMARY OF THE INVENTION

Therefore, the present invention has been made in view of the above problems, and it is an object of the present invention to provide a method for separating a sapphire wafer serving as a substrate, provided with semiconductor elements such as LEDs formed thereon, into chips, in which the sapphire wafer is easily and efficiently scribed by controlling stress on a rear surface of the sapphire wafer, thus preventing defects in the shape of the obtained chips and reducing the quantity of abrasion of an expansive diamond tip.

In accordance with the present invention, the above and other objects can be accomplished by the provision of a method for separating a sapphire wafer serving as a substrate, on which semiconductor elements are formed, into unit chips, comprising the steps of: (a) grinding a rear surface of the sapphire wafer so that the sapphire wafer has a designated thickness; (b) lapping the rear surface of the ground sapphire wafer so that the sapphire wafer has a designated thickness; (c) dry-etching the rear surface of the lapped sapphire wafer so that the sapphire wafer has a uniform thickness; and (d) scribing the rear surface of the dry-etched sapphire wafer.

Preferably, the step (c) may be performed by an RIE (Reactive Ion Etching) method for 50 seconds or more, and an RF bias voltage of at most 26 W may be imposed on the sapphire wafer in the step (c).

Further, preferably, the sapphire wafer may be dry-etched by 800 Å or more in the step (c).

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 5:
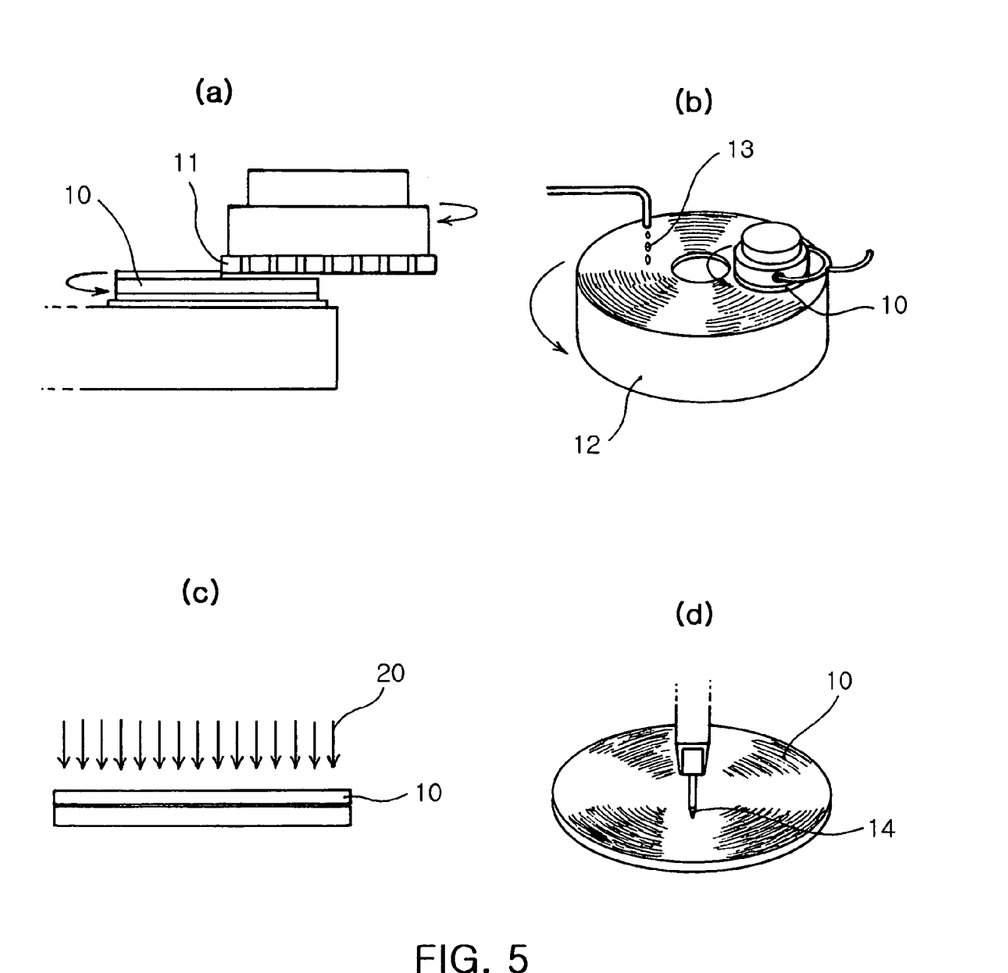
FIGS. 5a to 5d are schematic views illustrating a process for separating a sapphire wafer into chips in accordance with the present invention.

FIGS. 5a to 5d are schematic views illustrating a process for separating a sapphire wafer 10 into chips in accordance with the present invention. As shown in FIG. 5a, a rear surface of the sapphire wafer 10 is ground using a rotating diamond wheel 11 so that the sapphire wafer 10 has a designated thickness (for example, 115 μm).

As shown in FIG. 5b, the ground rear surface of the sapphire wafer 10 is lapped. In this lapping step, the ground sapphire wafer 10 is mounted on a lapping plate 12, and ground using a diamond slurry 13 having a particle size of 6 μm so that the sapphire wafer 10 has a designated thickness (for example, 81 μm).

Then, as shown in FIG. 5c, the rear surface of the lapped sapphire wafer 10 is dry-etched by a designated thickness. Generally, the dry-etching is performed by various methods. Preferably, the dry-etching is performed by an RIE (Reactive Ion Etching) method, which has a short etching time, performs anisotropic etching and prevents semiconductor elements formed thereon from being contaminated. Using the dry-etching, scratches formed in the rear surface of the sapphire wafer 10 after the lapping step are removed, thus preventing the occurrence of cracks generated when the sapphire wafer 10 is scribed. Compared to the polishing step employed by the conventional method, the dry-etching causes the sapphire wafer 10 to have larger processing stress on its rear surface. Accordingly, since the sapphire wafer 10 is easily cut with a diamond tip when the sapphire wafer 10 is scribed, the scribing of the sapphire wafer 10 is more precisely and easily performed.

Finally, as shown in FIG. 5d, the dry-etched rear surface of the sapphire wafer 10 is scribed using a diamond tip 14.

Figure 6:
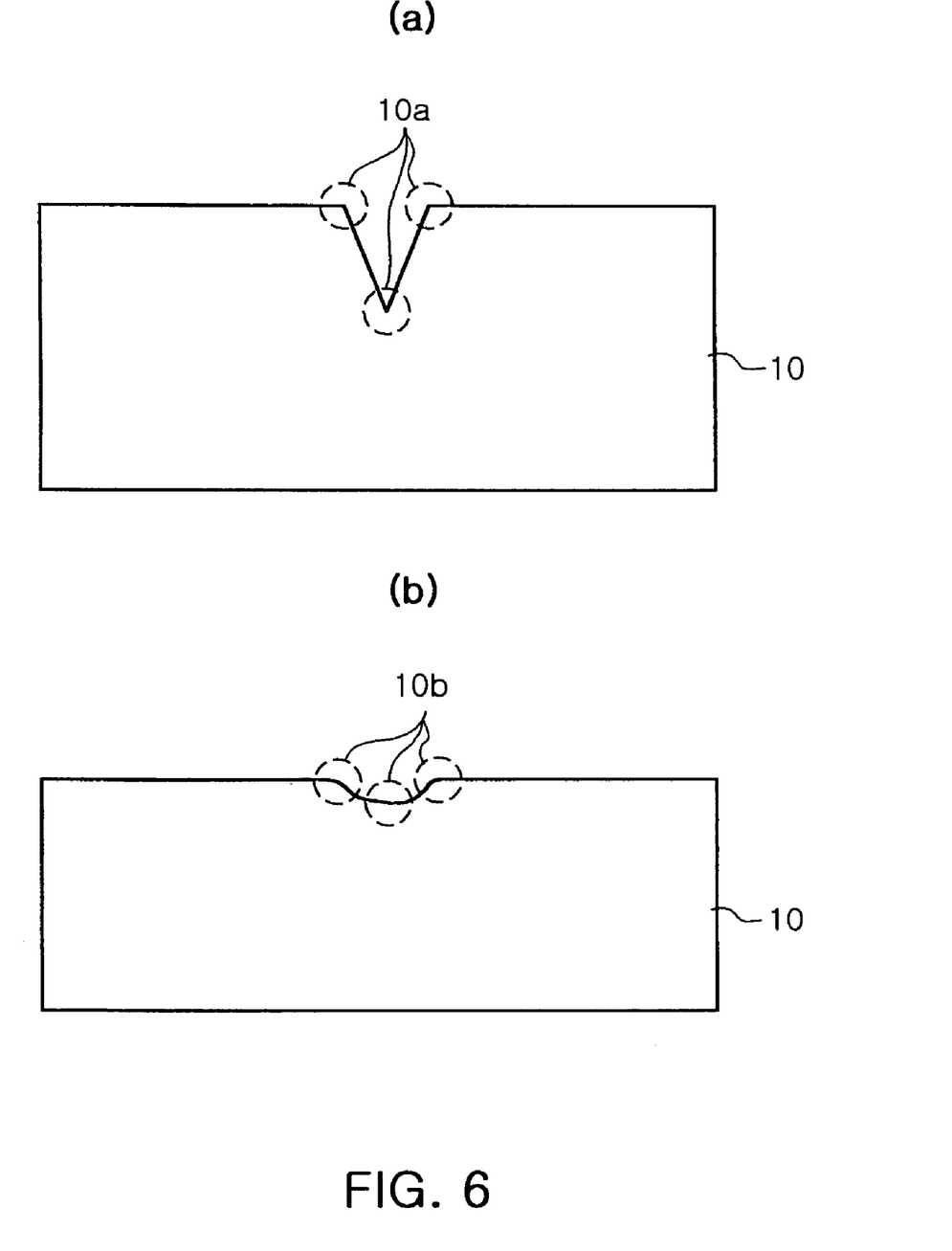
FIG. 6a is a cross-sectional view of a lapped sapphire wafer.
FIG. 6b is a cross-sectional view of a dry-etched sapphire wafer.
Figure 7:
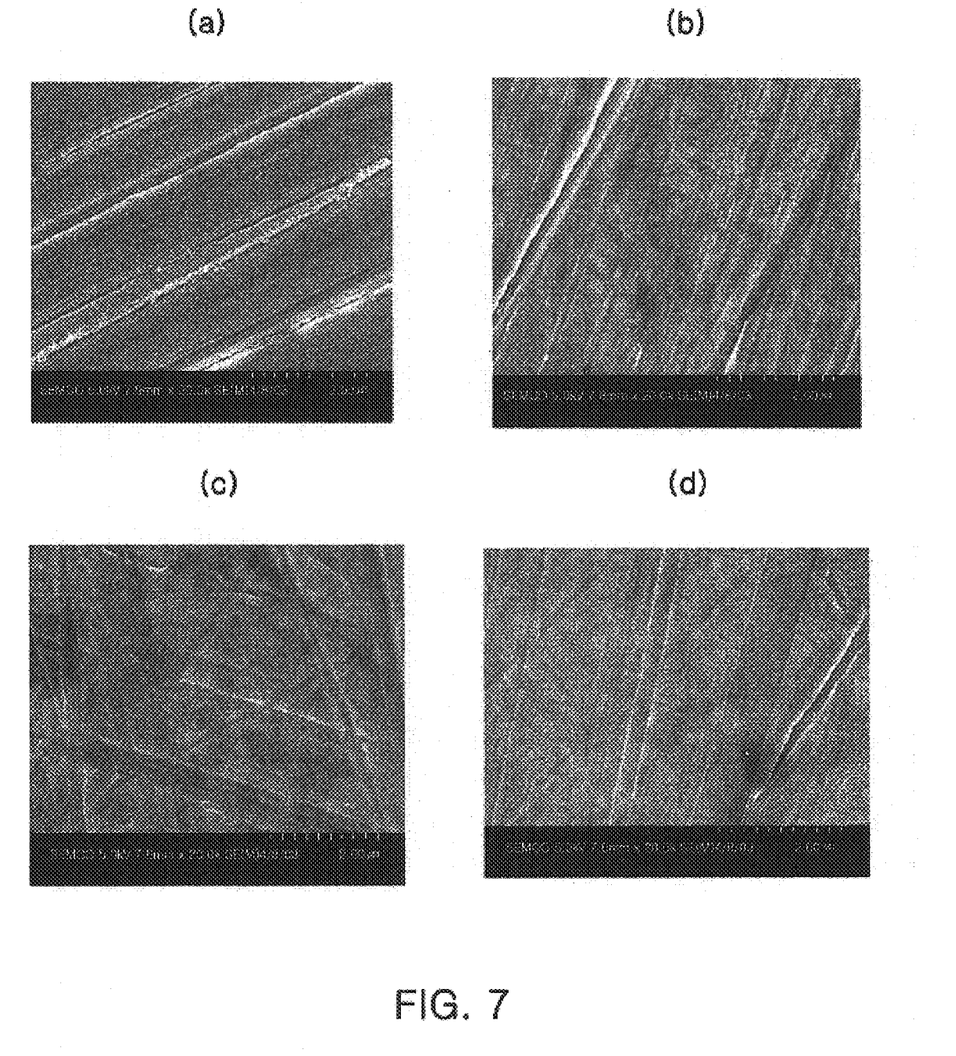
FIGS. 7a to 7d are scanning electron microscopic photographs illustrating change of a surface of a sapphire wafer according to the progressive time of dry-etching.

FIGS. 6a and 6b are cross-sectional views of the sapphire wafer 10 for illustrating change of the sapphire wafer 10 after the dry-etching step. As described above with reference to FIG. 2a, deep scratches are formed in the lapped rear surface of the sapphire wafer 10. FIG. 6a is a cross-sectional view of the lapped sapphire wafer 10, in which the scratches are formed in the rear surface. As shown in FIG. 6a, the scratches are formed in the lapped rear surface of the sapphire wafer 10. In FIG. 6a, reference numeral 10a represents a portion on which processing stress is densely concentrated. In case that a force is imposed on the sapphire wafer 10 in the scribing step, cracks are concentrically generated at the portion 10a. When the sapphire wafer 10 shown in FIG. 6a is dry-etched, the scratch has a reduced depth and the shape of the portion 10a is blunt, as shown in FIG. 6b. That is, the portion 10a of FIG. 6a is changed into a portion represented by reference numeral 10b of FIG. 6b so that the stress concentration on the portion 10b is reduced and the probability of generation of cracks on the portion 10b in the scribing step is reduced. Accordingly, it is possible to decrease defects in the shape of chips separated from the sapphire wafer by scribing.

Preferably, the dry-etching employed by the method for separating the sapphire wafer into the chips in accordance with the present invention is performed by an RIE (Reactive Ion Etching) method. FIGS. 7a to 7d show change of the surface of the sapphire wafer according to variation of the dry-etching time. FIGS. 7a to 7d are scanning electron microscopic photographs of the surface of the sapphire wafer under the condition that the dry-etching is performed for 50, 100, 200 and 400 seconds, respectively. With reference to FIGS. 7a to 7d, the longer the dry-etching time, the more scratches on the surface of the sapphire wafer after the lapping step are reduced. In order to prevent the cracks of the chip generated due to the scratches, it is preferable that the dry-etching is performed for 50 seconds or more.

Figure 8:
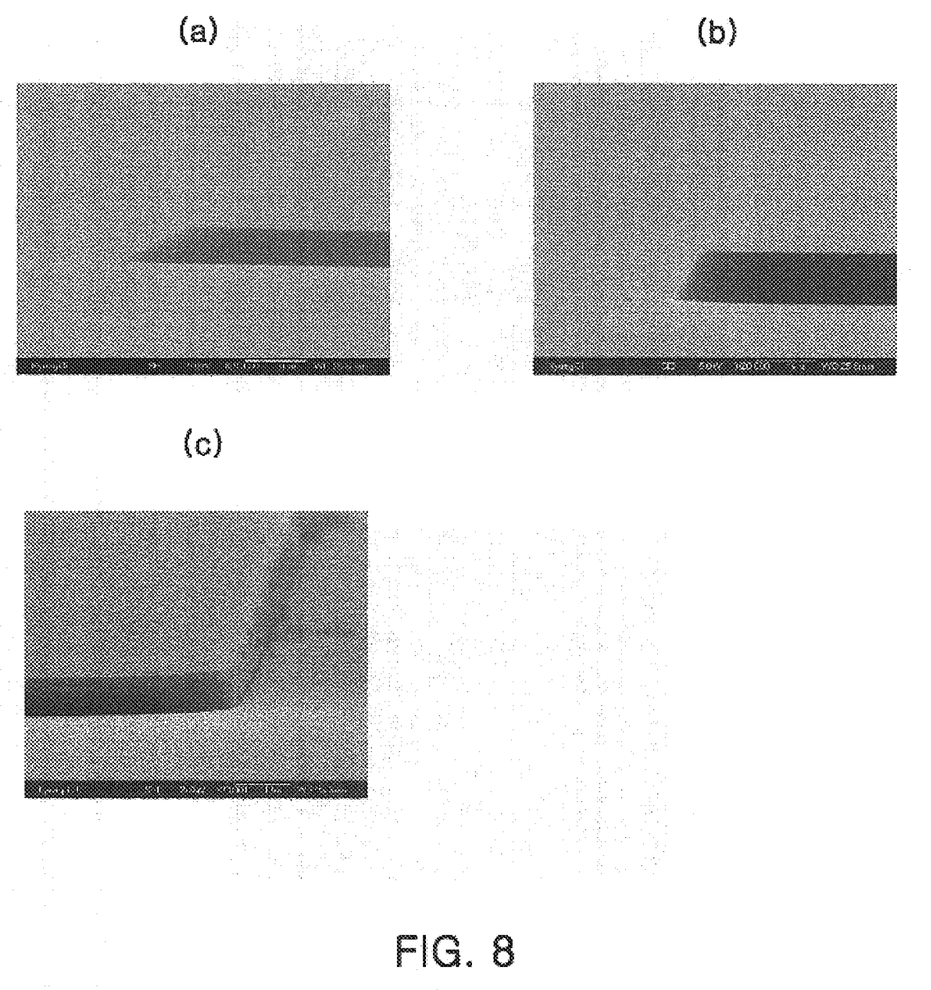
FIGS. 8a to 8c are photographs illustrating change of an etching state of the sapphire wafer according to the variation of an RF bias voltage for dry-etching.

FIGS. 8a to 8c are photographs illustrating change of an etching state of the sapphire wafer according to the variation of an RF bias voltage for dry-etching. Here, the RF bias voltage is one of the important variables for dry-etching. There are several variables for determining results of dry-etching. Among the variables, the RF bias voltage is a leading variable for determining an etching profile. FIGS. 8a, 8b and 8c show etching profiles at RF bias voltages of 19 W, 24 W and 26 W, respectively. As shown in FIGS. 8a to 8c, the higher the RF bias voltage becomes, the closer to a perpendicular line the etching profile becomes. That is, when the RF bias voltage is high, an etching rate is increased and the etching profile is close to the perpendicular line, thus allowing the sapphire wafer to have a uniform surface. Accordingly, it is possible to assure uniform qualities of chips separated from the sapphire wafer in the scribing step.

However, when the RF bias voltage exceeds 26 W, there is generated burning of a PR mask. Accordingly, it is preferable that the RF bias voltage of dry-etching employed by the present invention is 26 W at maximum.

Figure 9:
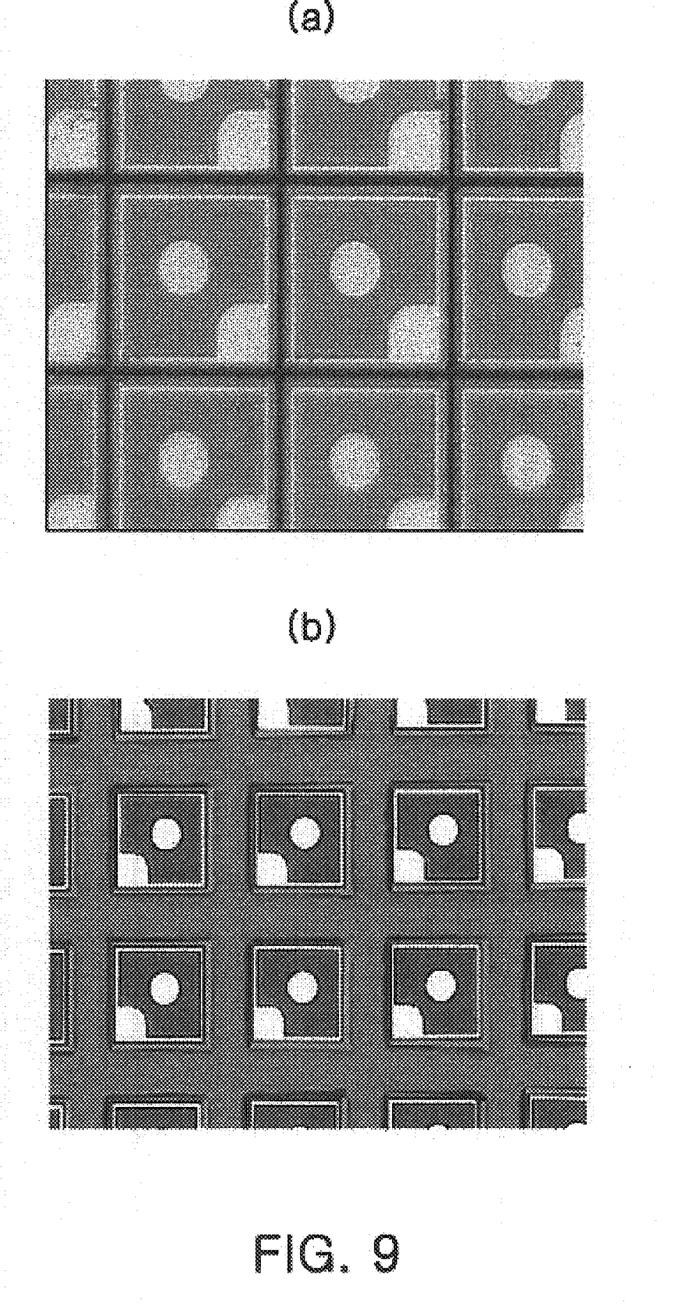
FIG. 9a is a photograph of a sapphire wafer scribed into chips in accordance with the present invention.
FIG. 9b is a photograph of resulting chips separated from the sapphire wafer in accordance with the present invention.

As described above, the scribing of the sapphire wafer is more easily performed by means of the dry-etching step. FIG. 9a is a photograph of a sapphire wafer scribed into chips in accordance with the present invention, and FIG. 9b is a photograph of resulting chips separated from the sapphire wafer in accordance with the present invention. As shown in FIG. 9a, boundaries of scribed chips are clean and neat, and as shown in FIG. 9b, edges of separated chips are clean, thus showing that defects in the shape of chips are greatly minimized. This effect of the method of the present invention is more clearly understood by comparing the scribing results obtained by the method of the present invention, shown in FIGS. 9a and 9b, to the scribing results obtained by the conventional method, shown in FIGS. 4a and 4b.

In accordance with the conventional method shown in FIG. 4a, the sapphire wafer, which is polished, has a weak processing stress of its surface and is not easily scribed into chips using a diamond tip. Accordingly, boundaries of chips scribed from the sapphire wafer are not clean. On the other hand, in accordance with the method of the present invention as shown in FIG. 9a, the sapphire wafer, which is not polished but dry-etched, maintains a designated processing stress of its surface and is easily scribed into chips using the diamond tip. As a result, boundaries of chips scribed from the sapphire wafer are more clearly formed. The above-described scribing results cause the difference of shapes of chips separated from the sapphire wafers between the conventional method and the method of the present invention. As shown in FIG. 4b, the conventional method causes the scribing of the sapphire wafer into the chips not to be clearly performed, thus generating defects in the shape of the chips separated from the sapphire wafer. On the other hand, as shown in FIG. 9b, the method of the present invention does not generate defects in the shape of the chips separated from the sapphire wafer.

In accordance with the method of the present invention, since the surface of the sapphire wafer is easily scribed into chips using the diamond tip, the quantity of abrasion of the diamond tip is notably reduced. The method of the present invention reduces the quantity of abrasion of the diamond tip adapted to separate the sapphire wafer into the chips, which is an expensive piece of equipment, thus decreasing unit cost of chip products and strengthening the competitiveness of the chip products.

As apparent from the above description, the present invention provides a method for separating a sapphire wafer serving as a substrate, provided with semiconductor elements formed thereon, into chips by means of scribing, in which a rear surface of the sapphire wafer is ground, lapped and then dry-etched without application of polishing, thus maintaining a processing stress of the rear surface of the sapphire wafer at a designated level and allowing the sapphire wafer to be easily and efficiently scribed. Accordingly, the method of the present invention prevents defects in the shape of the obtained chips so as to improve yield of the chips, and reduces the quantity of abrasion of an expensive diamond tip so as to reduce unit cost of the chips, thus increasing productivity and strengthening the competitiveness of the chip products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for separating a sapphire wafer serving as a substrate, on which semiconductor elements are formed, into unit chips, comprising the steps of:
   (a) grinding a rear surface of the sapphire wafer so that the sapphire wafer has a designated thickness;
   (b) lapping the rear surface of the ground sapphire wafer so that the sapphire wafer has a designated thickness;
   (c) dry-etching the rear surface of the lapped sapphire wafer so that the sapphire wafer has a uniform thickness; and
   (d) scribing the rear surface of the dry-etched sapphire wafer;

wherein said dry-etching is performed after said lapping without a polishing process between said lapping and said dry-etching.

2. The method as set forth in claim 1, wherein the step (c) is performed by an RIE (Reactive Ion Etching) method.

3. The method as set forth in claim 1, wherein the step (c) is performed for 50 seconds or more.

4. The method as set forth in claim 1, wherein the sapphire wafer is dry-etched by 800 Å or more in the step (c).

5. The method as set forth in claim 1, wherein an RF bias voltage of at most 26 W is imposed on the sapphire wafer in the step (c).

6. A method of separating a sapphire wafer, on which semiconductor elements are formed, into unit chips, said method comprising the steps of:
  (a) grinding a rear surface of the sapphire wafer so that the sapphire wafer has a first designated thickness;
  (b) lapping the rear surface of the ground sapphire wafer so that the sapphire wafer has a second designated thickness smaller than the first designated thickness;
  (c) dry-etching the rear surface of the lapped sapphire wafer so that the sapphire wafer has a uniform thickness and a processing stress of the rear surface of the dry-etched sapphire wafer is maintained at a designated level; and
  (d) scribing the rear surface of the dry-etched sapphire wafer;
  wherein said dry-etching is performed after said lapping without a polishing process between said lapping and said dry-etching.

7. The method as set forth in claim 6, wherein step (c) is performed by an RIE (Reactive Ion Etching) method.

8. The method as set forth in claim 6, wherein step (c) is performed for 50 seconds or more.

9. The method as set forth in claim 6, wherein the sapphire wafer is dry-etched by 800 Å or more in step (c).

10. The method as set forth in claim 6, wherein an RF bias voltage of at most 26 W is imposed on the sapphire wafer in step (c).

11. The method as set forth in claim 6, wherein the processing stress of the rear surface of the dry-etched sapphire wafer is higher than a processing stress obtainable by a polishing process, thereby facilitating cutting of said rear surface of the dry-etched sapphire wafer with a diamond tip in said scribing step.

12. The method as set forth in claim 11, wherein
  after said lapping, the rear surface of said lapped sapphire wafer includes at least one scratch; and
  said dry-etching is performed to reduce a depth of said at least one scratch, without completely removing said at least one scratch.

13. The method as set forth in claim 12, wherein
  after said lapping, the rear surface of said lapped sapphire wafer includes at least one scratch; and
  said dry-etching is performed to change said at least one scratch to a shallower scratch having a blunter shape, without completely removing said at least one scratch.

14. A method of separating a sapphire wafer, on which semiconductor elements are formed, into unit chips, said method comprising the steps of:
  (a) grinding a rear surface of the sapphire wafer so that the sapphire wafer has a first designated thickness;
  (b) lapping the rear surface of the ground sapphire wafer so that the sapphire wafer has a second designated thickness smaller than the first designated thickness;
  (c) dry-etching the rear surface of the lapped sapphire wafer so that the sapphire wafer has a uniform thickness and a processing stress of the rear surface of the dry-etched sapphire wafer is maintained at a designated level; and
  (d) scribing the rear surface of the dry-etched sapphire wafer with a diamond tip;
  wherein
  said dry-etching is performed after said lapping without a polishing process between said lapping and said dry-etching;
  after said lapping, the rear surface of said lapped sapphire wafer includes at least one scratch; and
  said dry-etching is performed to reduce a depth of said at least one scratch, without completely removing said at least one scratch, thereby maintaining a processing stress of the rear surface of the dry-etched sapphire wafer at a sufficiently high level that facilitates cutting of said rear surface of the dry-etched sapphire wafer with the diamond tip in said scribing step.

15. The method as set forth in claim 14, wherein said dry-etching is performed to change said at least one scratch to a shallower scratch having a blunter shape, without completely removing said at least one scratch.

16. The method as set forth in claim 14, wherein said lapping comprises using a diamond slurry having a particle size of 6 μm.

17. The method as set forth in claim 16, wherein a processing stress of the rear surface of the dry-etched sapphire wafer is higher than a processing stress obtainable by a polishing process using a particle size of 3 μm, thereby facilitating cutting of said rear surface of the dry-etched sapphire wafer with a diamond tip in said scribing step.

18. A method of separating a sapphire wafer, on which semiconductor elements are formed, into unit chips, said method comprising the steps of:
  (a) grinding a rear surface of the sapphire wafer so that the sapphire wafer has a first designated thickness;
  (b) lapping the rear surface of the ground sapphire wafer so that the sapphire wafer has a second designated thickness smaller than the first designated thickness;
  (c) dry-etching the rear surface of the lapped sapphire wafer so that the sapphire wafer has a uniform thickness and a processing stress of the rear surface of the dry-etched sapphire wafer is maintained at a designated level; and
  (d) scribing the rear surface of the dry-etched sapphire wafer;
  wherein the processing stress of the rear surface of the dry-etched sapphire wafer is higher than a processing stress obtainable by a polishing process, thereby facilitating cutting of said rear surface of the dry-etched sapphire wafer with a diamond tip in said scribing step.

19. The method as set forth in claim 18, wherein
  after said lapping, the rear surface of said lapped sapphire wafer includes at least one scratch; and
  said dry-etching is performed to reduce a depth of said at least one scratch, without completely removing said at least one scratch.

20. The method as set forth in claim 19, wherein
  after said lapping, the rear surface of said lapped sapphire wafer includes at least one scratch; and
  said dry-etching is performed to change said at least one scratch to a shallower scratch having a blunter shape, without completely removing said at least one scratch.

* * * * *